United States Patent [19]

Arseneau et al.

[11] Patent Number: 4,937,520
[45] Date of Patent: Jun. 26, 1990

[54] INSTRUMENT TO MEASURE THE ERRORS OF APPARENT POWER METERS

[75] Inventors: Réjean J. Arseneau; Piotr S. Filipski; John J. Zelle, all of Orleans, Canada

[73] Assignee: Canadian Patents and Development Ltd., Ottawa, Canada

[21] Appl. No.: 409,750

[22] Filed: Sep. 20, 1989

[30] Foreign Application Priority Data

Oct. 25, 1988 [CA] Canada .................................. 582058

[51] Int. Cl.$^5$ ...................... G01R 19/00; G01R 29/04
[52] U.S. Cl. .................................... 324/76 R; 324/74; 324/140 D; 324/141; 324/620; 328/163
[58] Field of Search ................. 324/613, 614, 620, 74, 324/130, 103 R, 142, 141, 140 D, 102, 76 R, 107; 328/160, 161, 162, 163; 307/529; 364/551.01

[56] References Cited

U.S. PATENT DOCUMENTS

| 2,213,099 | 8/1940 | Adorjan ............................. 328/162 |
| 2,564,829 | 8/1951 | Bedford et al. .................... 324/76 R |
| 2,648,821 | 8/1953 | Petzinger ............................. 324/74 |
| 4,542,514 | 9/1985 | Watanabe ............................. 328/163 |

*Primary Examiner*—Ernest F. Karlsen
*Attorney, Agent, or Firm*—Harold A. Kelly

[57] ABSTRACT

An instrument to determine, under actual field conditions, which type of VA demand meters are most appropriate for a particular consumer. The type of electrical load that the consumer places on an electrical supply system can introduce harmonics and phase distortion in the system resulting in VA meters producing incorrect readings. These VA meters are intended to measure the true apparent power S which is defined as $S = V_{rms} X I_{rms}$ but, are generally designed to operate according to one of the following approximate formula:

(1) $S' = V_{rect} X I_{rect} X (1.11)^2$ and (2) $S'' = \sqrt{P^2 + Q^2}$ where P is the active power and Q the reactive power.

The instrument contains circuit to measure the rms values of the voltage and current waveforms from which the true apparent power S can be obtained as well as circuits to determine the value S' and S'' according to the two approximate formula from which error signals $e_1$ and $e_2$ can be determined to indicate the type of errors that can be expected from VA meters designed to operate according to the two approximate formula and, as a result, determine which type of VA meter is most appropriate for a particle consumer.

9 Claims, 1 Drawing Sheet

INSTRUMENT TO MEASURE THE ERRORS OF APPARENT POWER METERS

FIELD OF INVENTION

The present invention is directed to an instrument to determine the errors in the readings of different types of VA demand meters under field conditions and establish which type of VA demand meter is most suitable for a particular environment and customer.

BACKGROUND OF THE INVENTION

Large consumers of electrical energy are generally billed to cover the operating costs of energy production and also to recover the high capital costs associated with the delivery of the highest energy demand. The former are calculated from results of energy measurements such as a watt-hour meter and the latter from a maximum VA demand registration (short term average, e.g. 15 minutes) as determined by VA demand meters which are designed to measure the apparent power S.

The apparent power is defined as:

$$S = V_{rms} \times I_{rms} \qquad (1)$$

where $V_{rms}$ and $I_{rms}$ are the rms values of the supply voltage and line current. However, two commonly used approximate formula for apparent power are:

$$S' = V_{rect} \times I_{rect} \times (1.11)^2 \qquad (2)$$

where $V_{rect}$ and $I_{rect}$ are the average of the rectified values of the voltage and current waveforms and $$S'' = \sqrt{P^2 + Q^2} \qquad (3)$$

where P and Q are the active and reactive powers of the waveforms. The term "1.11" in equation (2) is the form factor of a sine wave representing the ratio of the rms and average values of a sine wave.

Meters measuring the true value of apparent power S are relatively expensive to manufacture and, as a result, over the years manufacturers have built a number of VA meters operating according to the approximate equations (2) or (3). However, these two approximate formulas can lead to errors if the waveforms for voltage and current are not sinusoidal waveforms.

One type of VA demand meter is a rectifier type instrument which measures KVA demand by applying rectified signals to a thermal element. This meter responds to the product of the average rectified values of the applied a.c. voltage and currents with its reading made proportional to the form factors squared of pure sinusoidal waveforms i.e. $1.11 \times V_{avg} \times 1.11 \times I_{avg}$. This type of meter is sensitive to the form factors of the waveforms. Since rectifiers are used in both the voltage and current circuits of the meter, if either the voltage or current waveform is distorted the meter will not accurately indicate the kVA demand. Another type of meter for a 3-phase system consists of two 3 element inductive watt-hour meters with microprocessor assisted calculations. The energy (watt-hours) is measured by a conventional inductive watt-hour meter whereas the second inductive meter is connected to register a quantity called a "Q-hour" rather than the reactive power. The latter measurement requires voltage phasor phase shifting by 90° while the former uses only a 60° phase shift. The microprocessor calculates kVA from the watt-hour (Wh) and Q-hour (Qh) registration as $$VA = \sqrt{Wh^2 + \left(\frac{2Qh - Wh}{\sqrt{3}}\right)^2}$$

which is the same as that calculated according to equation (3). Again, this type of meter will give inaccurate readings for distorted waveforms since the Q-hour meter will not respond properly to higher harmonics and, in addition, approximate equation (3) is not correct for distorted waveform conditions.

Large consumers of electric energy subject the electric grid system to electrical loads which result in harmonics being introduced into the system and therefore distortions of the current and voltage waveforms. In recent years, the growing presence of converting apparatus has led to a steady increase in the level of these harmonics and, since revenue meters are designed to operate under sinusoidal conditions, this has raised questions concerning the accuracy of these meters in field conditions where harmonics are present. The amount and type of distortion will vary for different consumers depending on their type of load.

The present techniques of analyzing field conditions for possible difficulties with meters is to first collect samples of on site voltage and current waveforms which are then analyzed to determine their harmonic content. These field conditions are reproduced in a laboratory and field meters of different types are then compared to the performance of known standards. There are major disadvantages to this approach in that the results are not available on site and a large investment in equipment is necessary. Furthermore, after weeks of laboratory test, often expensive field trips are organized to investigate the situation only to find that no problems actually existed with that particular consumer. Therefore, there is a need for an instrument which can determine errors of different types of meters, particularly VA meters, under actual field conditions when connected to real loads where the voltage and current waveforms may be distorted. The type of meter most suitable for that particular field condition can then be determined. These errors in the VA meter readings appear to be more severe when three phase meters are connected in a three phase distribution system.

SUMMARY OF INVENTION

It is an object of the present invention to provide an instrument to determine which type of VA meter is most suitable for a particular consumer and to more accurately measure the apparent power S, particularly when that consumer's electric load introduces a large amount of harmonics into the system and therefore distortions of the voltage and current waveforms.

It is an object of the present invention to provide an instrument which simulates the common methods of measuring apparent power and determines the errors of the two commonly used approximate methods as compared to the true apparent power measurement and which can be installed in actual field conditions to determine which type of meter is most suitable for those field conditions.

This instrument is a relatively simple device which can determine on site the true apparent power of the voltage and current waveforms and then determine the errors that may be expected for different types of apparent power meters built so that they operate according to the approximate equations (2) or (3).

An instrument, according to a preferred embodiment of the present invention, comprises a circuit to determine the rms value of input voltage and current signals, the rms values being applied to a first multiplier circuit whose output indicates the true apparent power S where $S = V_{rms} \times I_{rms}$, means to determine the apparent power S' according to an approximate formula $S' = V_{rect} \times I_{rect} \times (1.11)^2$ where $V_{rect}$ and $I_{rect}$ are the average of the rectified input voltage and current respectively, means to determine the apparent power S'' according to an approximate formula $S'' = \sqrt{P^2 + Q^2}$ where P is the active power and Q the reactive power of the input voltage and current, means to determine a first error signal between S and S' and means to determine a second error signal between S and S''.

In a further embodiment, the means to determine the apparent power S' includes two rectifier circuits to rectify the input voltage and current signals to obtain their average rectified values, the outputs of the rectifier circuits being applied to a second multiplier circuit along with the constant $(1.11)^2$, the output of the second multiplier circuit indicating the apparent power S'.

In a still further embodiment the means to determine the apparent power S'' includes third and fourth multiplier circuits, the input voltage and current signals being applied to the third multiplier circuit whose output signal indicates the active power P, one of the input voltage or current signals being applied to the fourth multiplier circuit through a 90° phase shifting circuit while the other voltage or current signal is directly applied to the fourth multiplier circuit whose output indicates the reactive power Q, the output signals P and Q being applied to first and second squaring circuits respectively, outputs of the first and second squaring circuits being applied to an adder circuit whose output is applied to a circuit which determines the square root, the square root determining circuit's output indicating the apparent power S''.

BRIEF DESCRIPTION OF THE DRAWING

Other features and advantages of the present invention will become more readily apparent from the following detailed description of the preferred embodiment of the invention with reference to the accompanying drawing wherein.

DESCRIPTION OF THE PREFERRED EMBODIMENT

Figure 1:
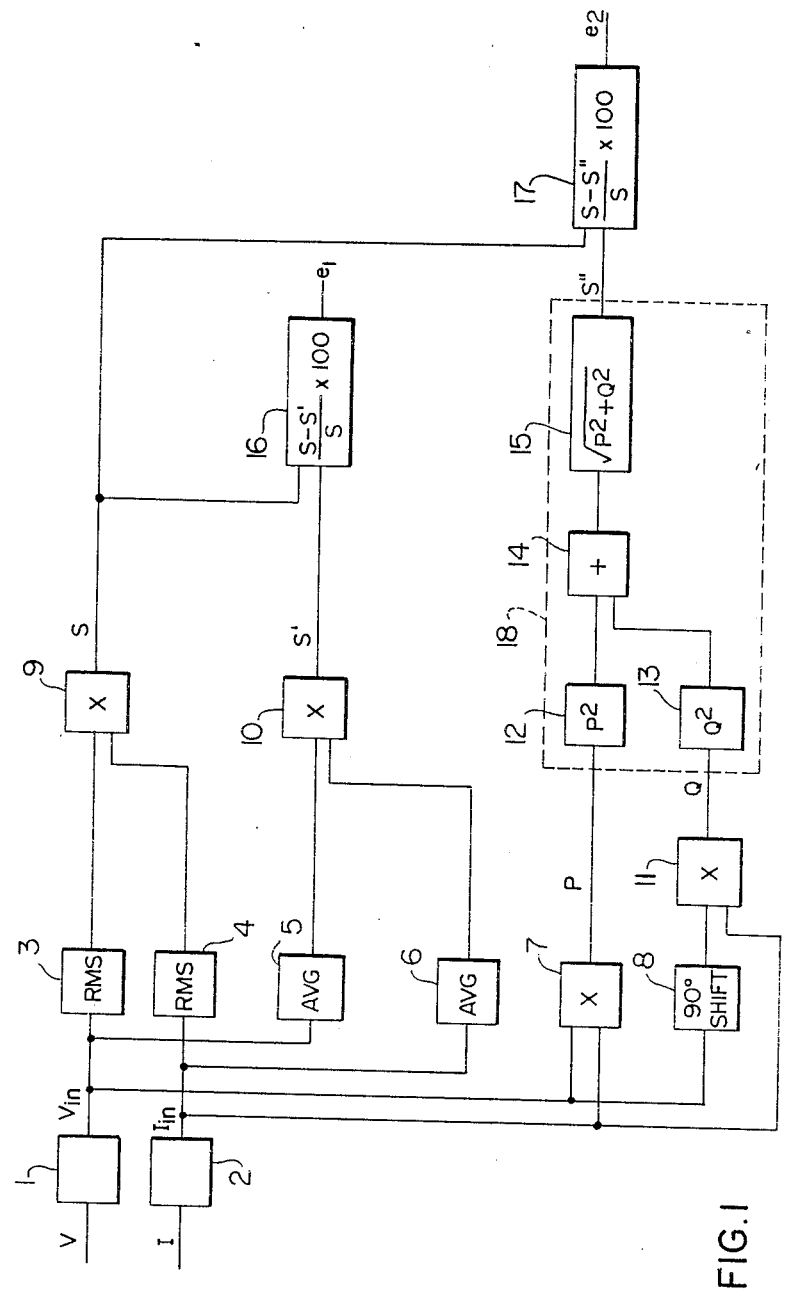
FIG. 1 shows a circuit diagram of the instrument according to the present invention.

Voltage and current waveforms from the grid system to a consumer are applied to two input transducers 1 and 2 of the instrument which supply output signals $V_{in}$ representing the voltage input and $I_{in}$ representing the current input to the consumer. The signals $V_{in}$ and $I_{in}$ are first applied to circuits 3 and 4 respectively which determine their rms value providing $V_{rms}$ and $I_{rms}$ signals which are then applied to a multiplier 9 to determine the value S which is:

$$S = V_{rms} \times I_{rms}$$

where S is the true apparent power.

The signals $V_{in}$ and $I_{in}$ are also applied to two rectifiers circuits 5 and 6 which provide the average of the rectified values of the voltage and current waveforms. These average values are then applied to a multiplier 10 whose output supplies the value $S' = V_{avg} \times I_{avg} \times (1.11)^2$ which corresponds to equation (2). The output S' is the reading which would be determined by a VA demand meter built so that it operates according to the approximate equation (2).

The signals $V_{in}$ and $I_{in}$ are, in addition, applied to a multiplying circuit 7 to obtain the active power P of the input waveforms. The voltage $V_{in}$ is also applied to a 90° phase shifting circuit 8 whose output is applied to a multiplier circuit 11. The other input of the multiplying circuit 11 is supplied with the signal $I_{in}$ so that the output of multiplier circuit 11 provides the reactive power Q. The outputs P and Q are then squared in squaring circuits 12 and 13 and the outputs of the squaring circuits 12 and 13 are added together in adder 14 whose output is applied to a circuit 15 which determines the square root $\sqrt{P^2 + Q^2}$ to provide an output S'' which corresponds to equation (3). S'' is the reading which would be determined by a VA demand meter built so that it operates according to approximate equation (3).

The output S from multiplier 9 and S' from multiplier 10 are applied to a circuit 16 which determines the value $S - S'/S \times 100$ providing a first error signal $e_1$ which indicates the type of error that could be expected from a VA meter operating according to the approximate equation (2) for these particular input voltages and currents.

The output S from multiplier 9 and S'' from circuit 15 are applied to a circuit 17 which determines the value $S - S''/S \times 100$ providing a second error signals $e_2$ which indicates the type of error that could be expected from a VA meter operating according to the approximate equation (3) for these input voltages and currents.

From the error signals $e_1$ and $e_2$ it can be determined which type of VA meter would be most appropriate for that particular type of load and which would provide the least error in their readings.

The circuits 12 to 15 may be included in a single integrated circuit 18 which determines the value $\sqrt{P^2 + Q^2}$.

Various other modifications may be made to the preferred embodiment without departing from the spirit and scope of the invention as defined by the appended claims.

We claim:

1. An instrument to determine errors in readings of different types of VA demand meters under field conditions comprising:
   (a) circuits to determine the rms values of input voltage and current signals, the rms values being applied to a first multiplier circuit whose output is the true apparent power S where $S = V_{rms} \times I_{rms}$,
   (b) means to determine the apparent power S' according to an approximate formula $S' = V_{rect} \times I_{rect} \times (1.11)^2$ where $V_{rect}$ and $I_{rect}$ are the average of the rectified input voltage and current respectively,
   (c) means to determine the apparent power S'' according to an approximate formula $S'' = \sqrt{P^2 + Q^2}$ where P is the active power and Q the reactive power of the input voltage and current,
   (d) means to determine a first error signal between S and S' and (e) means to determine a second error signal between S and S".

2. An instrument as defined in claim 1, wherein the means to determine the apparent power S' includes two rectifier circuits to rectify the input voltage and current signals to obtain their average rectified values, the outputs of the rectifier circuits being applied to a second multiplier circuit along with the constant $(1.11)^2$, the output of the second multiplier circuit indicating the apparent power S'.

3. An instrument as defined in claim 1, wherein the means to determine the apparent power S" includes third and fourth multiplier circuits, the input voltage and current signals being applied to the third multiplier circuit whose output signal indicates the active power P, one of the input voltage or current signals being applied to the fourth multiplier circuit through a 90° phase shifting circuit while the other voltage or current signal is directly applied to the fourth multiplier circuit whose output indicates the reactive power Q, the output signals P and Q being applied to first and second squaring circuits respectively, outputs of the first and second squaring circuits being applied to an adder circuit whose output is applied to a circuit which determines the square root, the square root determining circuit's output indicating the apparent power S".

4. An instrument as defined in claim 2; wherein the means to determine the first error signal includes a further circuit whose inputs are connected to the outputs of the first and second multiplier circuit, the further circuit determining the value $S-S'/S \times 100$.

5. An instrument as defined in claim 3, wherein the means to determine the second error signal includes an additional circuit whose inputs are connected to outputs of the first multiplier circuit and the square root determining circuit, the additional circuit determining the value $S-S''/S \times 100$.

6. An instrument as defined in claim 2; wherein the means to determine the apparent power S" includes third and fourth multiplier circuits, the input voltage and current signals being applied to the third multiplier circuit whose output signal indicates the active power P, one of the input voltage or current signals being applied to the fourth multiplier circuit through a 90° phase shifting circuit while the other voltage or current signal is directly applied to the fourth multiplier circuit whose output indicates the reactive power Q, the output signals P and Q being applied to first and second squaring circuits respectively, outputs of the first and second squaring circuits being applied to an adder whose output is applied to a circuit which determines the square root and indicates the apparent power S".

7. An instrument as defined in claim 6; wherein the means to determine the first error signal includes a further circuit whose inputs are connected to the outputs of the first and second multiplier circuit, the further circuit determining the value $S-S'/S \times 100$ and the means to determine the second error signal includes an additional circuit whose inputs are connected to outputs of the first multiplier circuit and the square root determining circuit, the additional circuit determining the value $S-S''/S \times 100$.

8. An instrument as defined in claim 3; wherein the first and second squaring circuits, the adder and the square root determining circuit are included in a single integrated circuit.

9. An instrument as defined in claim 6; wherein the first and second squaring circuits, the adder and the square root determining circuit are included in a single integrated circuit.

* * * * *